US008386968B2

(12) United States Patent
Pang

(10) Patent No.: US 8,386,968 B2
(45) Date of Patent: Feb. 26, 2013

(54) VIRTUAL PHOTO-MASK CRITICAL-DIMENSION MEASUREMENT

(75) Inventor: Linyong Pang, Los Gatos, CA (US)

(73) Assignee: Luminescent Technologies, Inc., Palo Alto, CA (US)

(*) Notice: Subject to any disclaimer, the term of this patent is extended or adjusted under 35 U.S.C. 154(b) by 98 days.

(21) Appl. No.: 12/955,617

(22) Filed: Nov. 29, 2010

(65) Prior Publication Data

US 2012/0137260 A1    May 31, 2012

(51) Int. Cl.
G06F 17/50    (2006.01)
(52) U.S. Cl. .................. 716/52; 716/50; 716/54
(58) Field of Classification Search .......... 716/50, 716/52, 54
See application file for complete search history.

(56) References Cited

U.S. PATENT DOCUMENTS

| | | | |
|---|---|---|---|
| 5,640,199 | A | 6/1997 | Garakani et al. |
| 6,042,998 | A | 3/2000 | Brueck et al. |
| 6,235,434 | B1 | 5/2001 | Sweeney et al. |
| 6,480,285 | B1 | 11/2002 | Hill |
| 6,484,306 | B1 | 11/2002 | Bokor et al. |
| 6,873,720 | B2 | 3/2005 | Cai et al. |
| 6,925,202 | B2 | 8/2005 | Karklin et al. |
| 7,003,755 | B2 | 2/2006 | Pang et al. |
| 7,043,071 | B2 | 5/2006 | Qian et al. |
| 7,073,162 | B2 | 7/2006 | Cobb et al. |
| 7,093,226 | B2 | 8/2006 | Pang |
| 7,093,229 | B2 | 8/2006 | Pang et al. |
| 7,124,394 | B1 | 10/2006 | Abrams et al. |
| 7,152,219 | B2 | 12/2006 | Pang |
| 7,178,127 | B2 | 2/2007 | Abrams et al. |
| 7,231,628 | B2 | 6/2007 | Pack et al. |

(Continued)

FOREIGN PATENT DOCUMENTS

WO   WO 2008/039674 A2   4/2008
WO   WO 2008/039674 A3   4/2008

OTHER PUBLICATIONS

Clifford, C. H., "Technique for Analyzing a Reflective Photo-Mask," U.S. Appl. No. 13/021,591, filed Feb. 4, 2011.

(Continued)

Primary Examiner — Stacy Whitmore
Assistant Examiner — Magid Dimyan
(74) Attorney, Agent, or Firm — Wilson Sonsini Goodrich & Rosati

(57) ABSTRACT

A technique for reconstructing a mask pattern corresponding to a photo-mask using a target mask pattern (which excludes defects) and an image of at least a portion of the photo-mask is described. This image may be an optical inspection image of the photo-mask that is determined using inspection optics which includes an optical path, and the reconstructed mask pattern may include additional spatial frequencies than the image. Furthermore, the reconstructed mask pattern may be reconstructed based on a characteristic of the optical path (such as an optical bandwidth of the optical path) using a constrained inverse optical calculation in which there are a finite number of discrete feature widths allowed in the reconstructed mask pattern, and where a given feature has a constant feature width. Consequently, the features in the reconstructed mask pattern may each have the constant feature width, such as an average critical dimension of the reconstructed mask pattern.

25 Claims, 8 Drawing Sheets

U.S. PATENT DOCUMENTS

| | | | |
|---|---|---|---|
| 7,254,251 | B2 | 8/2007 | Cai et al. |
| 7,302,090 | B2 | 11/2007 | Kalus et al. |
| 7,403,649 | B2 | 7/2008 | Cai et al. |
| 7,441,227 | B2 | 10/2008 | Abrams et al. |
| 7,480,889 | B2 | 1/2009 | Abrams et al. |
| 7,483,559 | B2 | 1/2009 | Luk-Pat et al. |
| 7,557,921 | B1 | 7/2009 | Adel et al. |
| 7,565,001 | B2 | 7/2009 | Cai et al. |
| 7,571,423 | B2 | 8/2009 | Abrams et al. |
| 7,617,474 | B2 | 11/2009 | Pang et al. |
| 7,646,906 | B2 | 1/2010 | Saidin et al. |
| 7,676,077 | B2 | 3/2010 | Kulkarni et al. |
| 7,689,966 | B2 | 3/2010 | Verma et al. |
| 7,695,876 | B2 | 4/2010 | Ye et al. |
| 7,698,665 | B2 | 4/2010 | Abrams et al. |
| 7,703,049 | B2 | 4/2010 | Abrams et al. |
| 7,703,068 | B2 | 4/2010 | Abrams et al. |
| 7,707,541 | B2 | 4/2010 | Abrams et al. |
| 7,749,666 | B2 | 7/2010 | Gassner et al. |
| 7,757,201 | B2 | 7/2010 | Abrams et al. |
| 7,769,225 | B2 | 8/2010 | Kekare et al. |
| 7,805,700 | B2 | 9/2010 | Peng |
| 7,853,920 | B2 | 12/2010 | Preil et al. |
| 7,984,391 | B2 | 7/2011 | Abrams et al. |
| 7,992,109 | B2 | 8/2011 | Abrams et al. |
| 7,995,832 | B2 | 8/2011 | Xiong et al. |
| 8,056,021 | B2 | 11/2011 | Abrams et al. |
| 8,057,967 | B2 | 11/2011 | Ye et al. |
| 8,200,002 | B2 | 6/2012 | Preil et al. |
| 8,204,295 | B2 | 6/2012 | Preil et al. |
| 8,208,712 | B2 | 6/2012 | Preil et al. |
| 8,260,032 | B2 | 9/2012 | Preil et al. |
| 8,280,146 | B2 | 10/2012 | Preil et al. |
| 2003/0103189 | A1 | 6/2003 | Neureuther et al. |
| 2003/0106642 | A1 | 6/2003 | Fairbairn et al. |
| 2004/0008880 | A1 | 1/2004 | Horie et al. |
| 2005/0122500 | A1 | 6/2005 | Ye et al. |
| 2006/0048089 | A1 | 3/2006 | Schwarzband |
| 2006/0051682 | A1 | 3/2006 | Hess et al. |
| 2006/0062445 | A1 | 3/2006 | Verma et al. |
| 2006/0273242 | A1 | 12/2006 | Hunsche et al. |
| 2007/0105029 | A1 | 5/2007 | Ausschnitt |
| 2007/0133862 | A1 | 6/2007 | Gold et al. |
| 2007/0198963 | A1 | 8/2007 | Granik et al. |
| 2008/0152212 | A1 | 6/2008 | Feldman |
| 2008/0170774 | A1 | 7/2008 | Xiong et al. |
| 2008/0241708 | A1* | 10/2008 | Lin et al. ............... 430/5 |
| 2010/0021042 | A1 | 1/2010 | Preil |
| 2010/0021043 | A1 | 1/2010 | Preil |
| 2010/0021824 | A1 | 1/2010 | Preil |
| 2010/0080443 | A1 | 4/2010 | Preil |
| 2010/0086195 | A1 | 4/2010 | Preil |
| 2010/0119143 | A1 | 5/2010 | Preil |
| 2010/0135568 | A1 | 6/2010 | Preil |
| 2011/0229805 | A1* | 9/2011 | Wang et al. ............... 430/5 |

OTHER PUBLICATIONS

Pang, L., "Technique for Analyzing a Reflective Photo-Mask," U.S. Appl. No. 13/024,233, filed Feb. 9, 2011.

Pang, L., "Virtual Photo-Mask Critical-Dimension Measurement," U.S. Appl. No. 12/955,617, filed Nov. 29, 2010.

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.

Pang, L. et al., "Computational Lithography & Inspection (CLI) and its Applications in Mask Inspection, Metrology, Review, and Repair," Luminescent Technologies Inc., Palo Alto, CA, Sep. 28, 2010.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

Office Action issued by U.S. Patent and Trademark Office, mailed Oct. 24, 2011, in Preil, Moshe E. et al., U.S. Appl. No., 12/475,349, "Photo-Mask and Wafer Image Reconstruction" filed May 29, 2009.

Response to Office Action filed Feb. 14, 2012, in Preil, Moshe E. et al., U.S. Appl. No., 12/475,349, "Photo-Mask and Wafer Image Reconstruction" filed May 29, 2009.

Petition Under C.F.R. § 1.78(A)(6) to Accept an Unintentionally Delayed Claim Under 35 U.S.C § 119(E) for the Benefit of a Prior Provisional Application filed Feb. 14, 2012 in Preil, Moshe E. et al., U.S. Appl. No., 12/475,349, "Photo-Mask and Wafer Image Reconstruction" filed May 29, 2009.

Notice of Allowance issued by U.S. Patent and Trademark Office, mailed Sep. 27, 2012, in Preil, Moshe E. et al., U.S. Appl. No. 12/475,349, "Photo-Mask and Wafer Image Reconstruction" filed May 29, 2009.

Petition Under C.F.R. § 1.78(A)(6) to Accept an Unintentionally Delayed Claim Under 35 U.S.C § 119(E) for the Benefit of a Prior Provisional Application filed Feb. 13, 2012, Preil, Moshe E. et al., U.S. Appl. No. 12/440,722, "Photo-Mask and Wafer Image Reconstruction" filed Feb. 5, 2010.

Preliminary Amendment filed Feb. 13, 2012, Preil, Moshe E. et al., U.S. Appl. No. 12/440,722, "Photo-Mask and Wafer Image Reconstruction" filed Feb. 5, 2010.

Written Opinion issued by U.S. Patent and Trademark Office, mailed Mar. 25, 2008, in Luminescent Technologies, Inc. International Application No. PCT/US07/078913, "Photo-Mask and Wafer Image Reconstruction" filing date Sep. 19, 2007.

Response to Written Opinion filed Jul. 17, 2008, in Luminescent Technologies, Inc. International Application No. PCT/US07/078913, "Photo-Mask and Wafer Image Reconstruction" filing date Sep. 19, 2007.

Chen, C.Y. et al, "Mask defect auto disposition based on aerial image in mask product", Proc. SPIE 7379, 73791F (2009).

* cited by examiner

INVERSE
OPTICAL
CALCULATION
400

FORWARD
OPTICAL
CALCULATION
500

VIRTUAL PHOTO-MASK CRITICAL-DIMENSION MEASUREMENT

BACKGROUND OF THE INVENTION

1. Field of the Invention

The present invention relates to techniques for inspecting and qualifying a photo-mask. More specifically, the invention relates to a technique for determining whether or not a photo-mask is acceptable by reconstructing a mask pattern of the photo-mask from a lower resolution image.

2. Related Art

Photolithography is a widely used technology for producing integrated circuits. In this technique, a light source illuminates a photo-mask. The resulting spatially varying light pattern is projected on to a photoresist layer on a semiconductor wafer by an optical system (referred to as an 'exposure tool'). By developing the 3-dimensional pattern produced in this photoresist layer, a layer in the integrated circuit is created. Furthermore, because there are often multiple layers in a typical integrated circuit, these operations may be repeated using several photo-masks to produce a product wafer.

Unfortunately, as dimensions in integrated circuits steadily become a smaller fraction of the wavelength of the light used to expose images of the photo-mask onto the wafer, the structures in or on the ideal photo-mask (which corresponds to a 'target mask pattern') and/or the physical structures in or on the actual photo-mask (which corresponds to a fabricated 'mask pattern') bear less and less resemblance to the desired or target pattern at the wafer. These differences between the target mask pattern and the target pattern are used to compensate for the diffraction and proximity effects that occur when light is transmitted through the optics of the exposure tool and is converted into the 3-dimensional pattern in the photoresist.

From a photo-mask or reticle manufacturing standpoint, the increasing dissimilarity between the photo-mask and the corresponding wafer patterns creates a broad new class of problems in photo-mask inspection and qualification. For example, if a defect in a photo-mask is detected, it is often unclear what impact this defect will have on the final pattern in the photoresist. In addition, photo-mask inspection devices often have a different numerical aperture, a different illumination configuration (or 'source aperture,' which is also referred to as a 'source pattern'), and even different light wavelength(s) than those used in the exposure tool. As a consequence, the image measured by an optical photo-mask inspection tool is often neither a perfect replica of the physical photo-mask nor the pattern (i.e., the aerial image) that will be exposed onto the wafer.

One existing approach to these challenges is to use a computer to simulate the resulting wafer pattern based on the optical inspection images of the photo-mask. By comparing simulations of wafer patterns corresponding to the ideal photo-mask (i.e., the target mask pattern) and those associated with an estimate of the actual photo-mask corresponding to the optical inspection images of the photo-mask, the significance of the defect may be determined. However, since the optical inspection images of the photo-mask may not be an accurate representation of the actual photo-mask, errors may be introduced when simulating wafer patterns, and thus, when trying to identify or classify defects. This may further complicate photo-mask inspection and qualification.

Alternatively, a higher-resolution image of the photo-mask than what can typically be obtained using the optical photo-mask inspection tool may be used in the simulations. For example, a spatial variation of a magnitude of the transmittance of the photo-mask may be determined using a scanning electron microscope (SEM). The resulting high-resolution image of the photo-mask (which is sometimes referred to as a 'critical-dimension scanning-electron-microscope' or 'CD-SEM' image) can provide a more accurate representation of the physical photo-mask than an optical inspection image.

However, measuring a CD-SEM image can be time consuming and complicated. In particular, the electron beam in an SEM often leads to charging of the photo-mask, which can attract dirt or contamination. Furthermore, subsequent cleaning of the photo-mask may produce additional defects in the photo-mask that are not included in the CD-SEM image and, thus, will not be included in the simulations. Therefore, even though a CD-SEM image can provide a more accurate representation of the original physical photo-mask, errors may still be introduced when simulating wafer patterns, and thus, when trying to identify or classify defects.

Hence, what is needed is a photo-mask inspection and qualification technique that overcomes the problems listed above.

SUMMARY OF THE INVENTION

The present disclosure relates to a computer system for determining a reconstructed mask pattern. During operation, the computer system receives a target mask pattern and an image of at least a portion of a photo-mask corresponding to a mask pattern, where the image is determined using inspection optics that includes an optical path. Then, the computer system reconstructs the mask pattern from the image based on a characteristic of the optical path and the target mask pattern. Furthermore, the mask pattern is reconstructed using a constrained inverse optical calculation in which there are a finite number of discrete feature widths allowed in the reconstructed mask pattern, and where a given feature has a constant feature width.

Note that the reconstructed mask pattern may be characterized by additional spatial frequencies than the image. Moreover, note that the spatial frequencies in the image may be approximately greater than or equal to an average critical dimension of the target mask pattern.

In some embodiments, the characteristic includes a range of wavelengths transmitted via the optical path.

Moreover, the features in the reconstructed mask pattern may each have the constant feature width. For example, the constant feature width may be an average critical dimension of the reconstructed mask pattern. Alternatively, primary features in the reconstructed mask pattern may each have the constant feature width, and sub-resolution assist features in the reconstructed mask pattern may each have another constant feature width, which is different than the constant feature width.

In some embodiments, the computer system compares the average critical dimension of the reconstructed mask pattern to the average critical dimension of the target mask pattern to determine a critical-dimension bias of the photo-mask. Furthermore, the computer system may determine an acceptance condition of the photo-mask based on the critical-dimension bias.

Note that the average critical dimension may be associated with a minimum of a cost function in the inverse optical calculation, where the cost function corresponds to a difference between the reconstructed mask pattern and the target mask pattern.

In the constrained inverse optical calculation, the image may be at an image plane of a model of the optical path and the mask pattern may be at an object plane of the model of the optical path. Furthermore, by constraining the inverse optical calculation, a convergence time of the inverse optical calculation may be faster than that of an unconstrained inverse optical calculation.

Another embodiment provides a method including at least some of the above-described operations.

Another embodiment provides a computer-program product for use in conjunction with the computer system.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings. Moreover, multiple instances of the same part are designated by a common prefix separated from an instance number by a dash.

DETAILED DESCRIPTION OF THE INVENTION

Figure 1A:
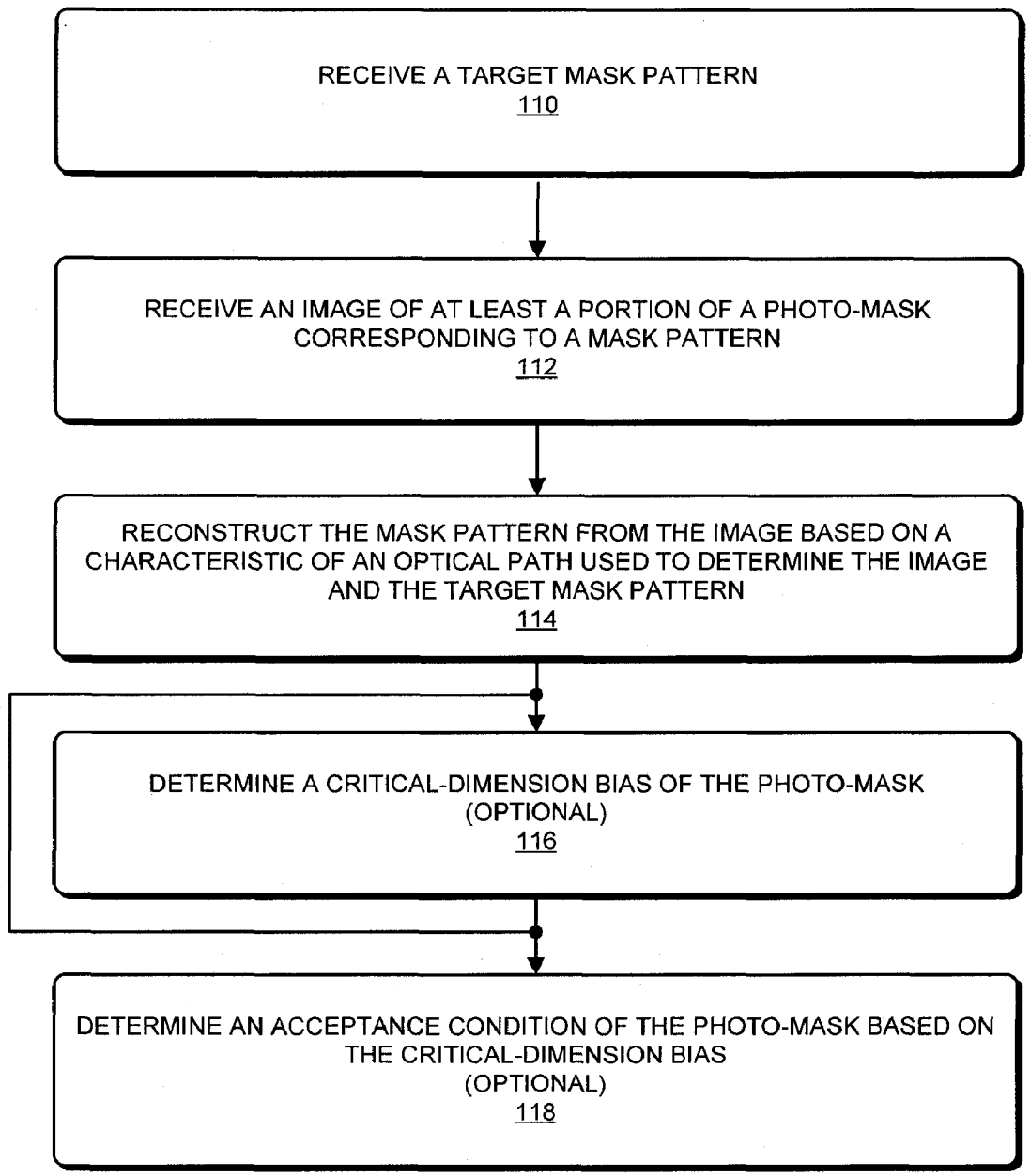
FIG. 1A is a flow chart illustrating a process for determining a reconstructed mask pattern in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software) for use with the computer system are described. These devices and processes may be used to reconstruct a mask pattern corresponding to a photo-mask using a target mask pattern (which excludes defects) and an image of at least a portion of the photo-mask. This image may be an optical inspection image of the photo-mask that is determined using inspection optics which includes an optical path, and the reconstructed mask pattern may include additional spatial frequencies than the image. Furthermore, the reconstructed mask pattern may be reconstructed based on a characteristic of the optical path (such as an optical bandwidth of the optical path) using a constrained inverse optical calculation in which there are a finite number of discrete feature widths allowed in the reconstructed mask pattern, and where a given feature has a constant feature width. Consequently, the features in the reconstructed mask pattern may each have the constant feature width, such as an average critical dimension of the reconstructed mask pattern.

By reconstructing the mask pattern, this calculation technique may facilitate improved photo-mask inspection and qualification. For example, the average critical dimension can be used to determine a critical-dimension bias of the photo-mask (relative to an average critical dimension of the target mask pattern) and, thus, to determine an acceptance condition of the photo-mask. Furthermore, the reconstructed mask pattern can be determined without measuring a critical-dimension scanning-electron-microscope (CD-SEM) image, and therefore may be less time consuming and less complicated than other photo-mask inspection techniques. Additionally, the calculation technique may not introduce additional defects in the photo-mask, which may improve photo-mask and wafer yield, thereby reducing overall photolithography cost and the time to market of integrated circuits.

In the discussion that follows, a photo-mask should be understood to include: a chromium-on-glass photo-mask, an alternating phase-shifting photo-mask, an attenuating phase-shifting photo-mask, and/or multiple-exposure photo-masks (e.g., where patterns printed on a wafer or semiconductor die using two or more photo-masks are combined to produce a desired or target pattern, such as a portion of an integrated circuit). Furthermore, a mask pattern should be understood to include the pattern of spatially varying transmittance magnitude and/or transmittance phase in a given photo-mask. Note that, typically, the manufactured or fabricated mask pattern in a given photo-mask deviates from an ideal target mask pattern, for example, because of defects that can occur during the photo-mask fabrication process.

In addition, in the discussion that follows note that an image and/or a pattern may include a bitmap or grayscale file that includes a set of values corresponding to pixels in the image and/or the pattern. Furthermore, the quantization (i.e., the number of bits) in these files may be varied, as needed, during the measurements and calculations that are described. Alternative formats having the same or similar information content, including a vector-based format such as a Graphic Design System II (GDSII) and/or an OASIS format, may be used in some embodiments of the images and/or patterns. And in some embodiments, the images and/or patterns include real and imaginary components (or equivalently, magnitude and phase information).

We now describe embodiments of the calculation technique. FIG. 1A presents a flow chart illustrating a method 100 for determining a reconstructed mask pattern, which is performed by a computer system (such as computer system 700 in FIG. 7). During operation, the computer system receives a target mask pattern (operation 110) and an image of at least a portion of a photo-mask corresponding to a mask pattern (operation 112), where the image is determined using inspection optics that includes an optical path. For example, the image may be a photo-mask inspection image that is obtained using an optical inspection system, such as a photo-mask inspection tool (e.g., the TeraScan™ photo-mask inspection system from KLA-Tencor, Inc., of San Jose, Calif.).

Then, the computer system reconstructs the mask pattern from the image based on a characteristic of the optical path and the target mask pattern (operation 114). For example, the characteristic may include a range of wavelengths transmitted via the optical path (such as an optical bandwidth of the optical path). Note that the mask pattern may be reconstructed using a constrained inverse optical calculation in which there are a finite number of discrete feature widths allowed in the reconstructed mask pattern, and where a given feature has a constant feature width. As described further below with reference to FIG. 4, in the constrained inverse optical calculation the image may be at an image plane of a model of the optical path and the mask pattern may be at an object plane of the model of the optical path. Furthermore, note that the reconstructed mask pattern may be characterized by additional spatial frequencies than the image. Thus, the reconstructed mask pattern may recover information in the mask pattern that was lost or distorted, e.g., by correcting image artifacts, when the image was measured, for example, because of a finite numerical aperture in the optical inspection system. For example, spatial frequencies in the image may be approximately greater than or equal to the average critical dimension of the target mask pattern. In contrast, spatial frequencies in the reconstructed mask pattern may correspond to a resolution that is 1% (or less) of an average critical dimension of the target mask pattern.

Figure 2A:
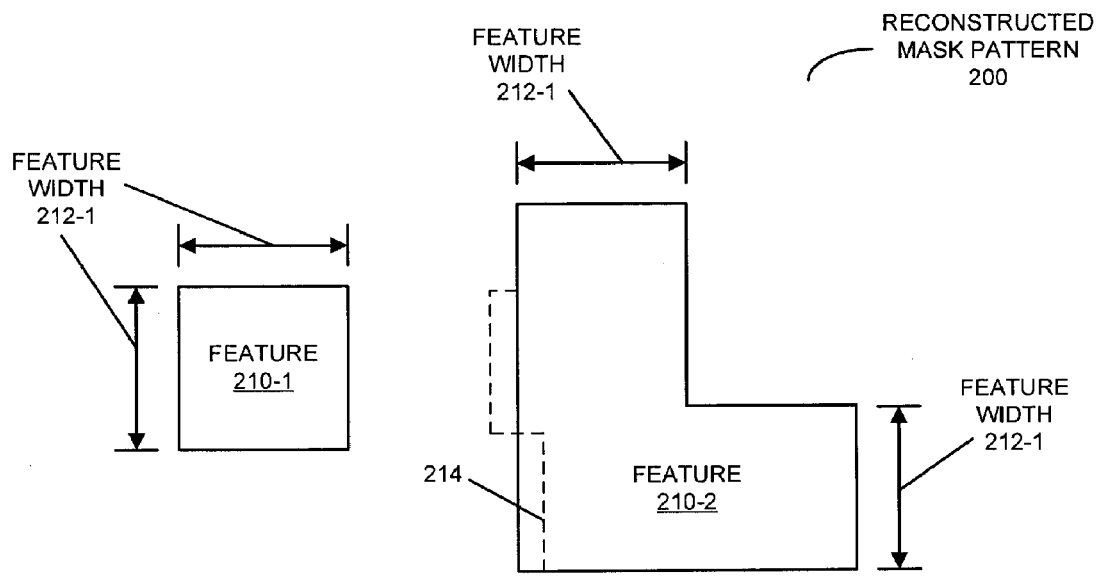
FIG. 2A illustrates a reconstructed mask pattern in accordance with an embodiment of the present invention.

As shown in FIG. 2A, which illustrates a reconstructed mask pattern 200, in some embodiments features 210 in reconstructed mask pattern 200 may each have constant feature width 212-1 (as opposed to a variable width, such as those associated with the edge steps illustrated by dashed line 214). For example, constant feature width 212-1 may be an average critical dimension of reconstructed mask pattern 200. Note that the average critical dimension may be associated with a minimum of a cost function in the inverse optical calculation, where the cost function corresponds to a difference between the reconstructed mask pattern (such as a simulated image of the reconstructed mask pattern) and the actual mask pattern (such as an image of the mask pattern). In this example, the finite number of discrete feature widths in reconstructed mask pattern 200 includes one feature width: feature width 212-1.

Figure 2B:
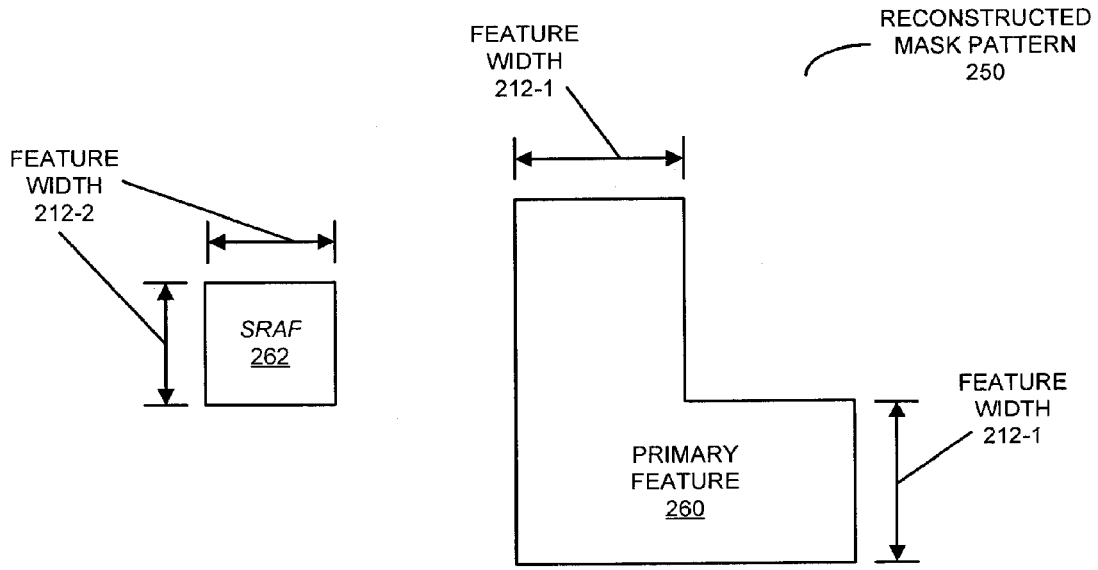
FIG. 2B illustrates a reconstructed mask pattern in accordance with an embodiment of the present invention.

Alternatively, as shown in FIG. 2B, which illustrates a reconstructed mask pattern 250, primary features (such as primary feature 260) in reconstructed mask pattern 250 may each have constant feature width 212-1, and sub-resolution assist features or SRAFs (such as SRAF 262) in reconstructed mask pattern 250 may each have another constant feature width 212-2, which is different than constant feature width 212-1. In this example, the finite number of discrete feature widths in reconstructed mask pattern 250 includes two feature widths: feature width 212-1 and feature width 212-2.

In this way, the reconstructed mask pattern obtained via the inverse optical calculation may constitute an efficient simplification of the actual mask pattern, and in the process may provide information (such as the average critical dimension) that can be used to qualify the photo-mask. In particular, referring back to FIG. 1A, in some embodiments the computer system optionally compares the average critical dimension of the reconstructed mask pattern to the critical dimension of the target mask pattern to determine a critical-dimension bias of the photo-mask (operation 116), which serves as an indicator of critical-dimension uniformity. Furthermore, the computer system may optionally determine an acceptance condition of the photo-mask based on the critical-dimension bias (operation 118). For example, if the critical-dimension bias exceeds an absolute or a relative criteria (such as 10 nm or 5% of the critical dimension), the photo-mask may be rejected, subject to rework, or subject to additional qualification testing.

As discussed further below with reference to FIG. 5, in some embodiments the computer system uses the reconstructed mask pattern to determine one or more aerial image(s) on a wafer using a forward optical calculation. In particular, the computer system may calculate the aerial image(s) at an image plane of a model of an optical path (such as the optical path associated with an exposure tool in a photolithographic process) using the reconstructed mask pattern and appropriate illumination by a source pattern (annular, quadrapole, arbitrary, etc.), at an object plane of the model of the optical path associated with the exposure tool. This simulation may use conditions associated with the photolithographic process (such as immersion optics, a disk illumination with a sigma of 0.75, a numerical aperture of 1.35, a wavelength of 193 nm, etc.). Furthermore, the computer system may calculate an estimated resist pattern on the wafer based on the determined aerial image(s) using a model of a photoresist in the photolithographic process, such as a model of a positive or a negative resist. Then, the computer system may identify differences between the estimated resist pattern and a target pattern (such as a portion of a circuit that is to be printed on a wafer or a semiconductor die), and may determine the acceptance condition of the photo-mask based on the identified differences. However, in some embodiments where the estimated resist patter is not calculated, the differences may be between the aerial image(s) and the target pattern.

Note that in addition to efficiently determining the critical-dimension bias of the photo-mask, by constraining the inverse optical calculation in method 100, a convergence time of the inverse optical calculation may be faster than that of an unconstrained inverse optical calculation. In addition, the average critical dimension determined when reconstructing the mask pattern in the constrained inverse optical calculation may be less noisy and more reproducible than the results obtained when the mask pattern is reconstructed in an unconstrained inverse optical calculation (which has a much larger number of degrees of freedom, such as the possible feature geometries or positions of edges of the features). For example, the accuracy of the average critical dimension determined using the constrained inverse optical calculation may have a standard deviation less than 0.5 nm in the reconstructed mask pattern, as opposed to a standard deviation of 0.8 nm in the reconstructed mask pattern when the unconstrained inverse optical calculation is used.

Figure 1B:
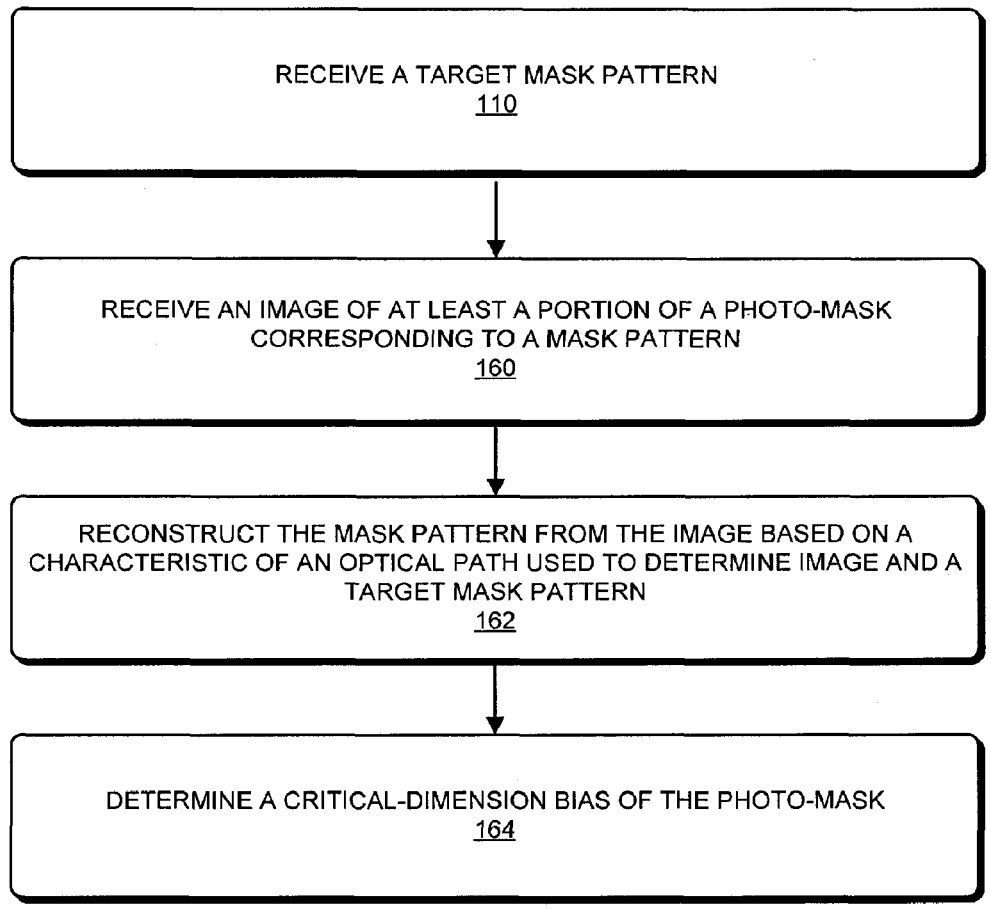
FIG. 1B is a flow chart illustrating a process for determining a reconstructed mask pattern in accordance with an embodiment of the present invention.
Figure 7:
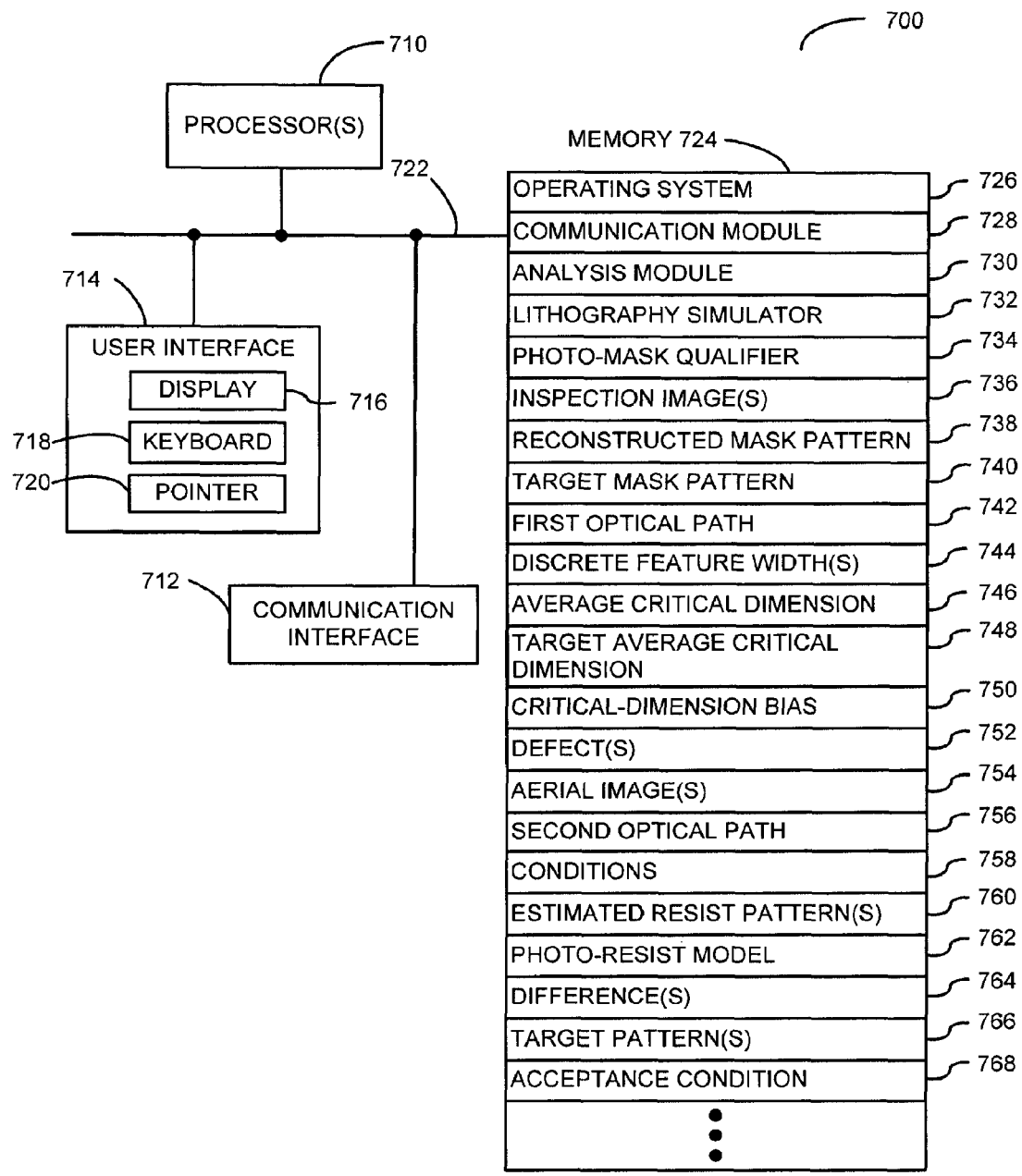
FIG. 7 is a block diagram illustrating a computer system in accordance with an embodiment of the present invention.

A variation on the calculation technique is shown in FIG. 1B, which presents a flow chart illustrating a method 150 for determining a reconstructed mask pattern, which is performed by a computer system (such as computer system 700 in FIG. 7). During operation, the computer system receives the target mask pattern (operation 110) and receives an image of at least the portion of the photo-mask corresponding to the mask pattern (operation 160), where spatial frequencies in the image are approximately greater than or equal to the average critical dimension of the target mask pattern. Then, the computer system reconstructs the mask pattern from the image based on a characteristic of the optical path and the target mask pattern (operation 162) using the constrained inverse optical calculation in which there are the finite number of discrete feature widths allowed in the reconstructed mask pattern, and where the given feature has the constant feature width. Next, the computer system determines the critical-dimension bias of the photo-mask from the finite number of discrete feature widths (operation 164).

In some embodiments of methods 100 (FIG. 1A) and 150 there may be additional or fewer operations. Moreover, the order of the operations may be changed, and/or two or more operations may be combined into a single operation. For example, instead of the image, in some embodiments the constrained inverse optical calculation uses a set of images. These images may be determined at different focal conditions in the optical inspection system (such as at different image planes or surfaces). More generally, the set of images may be obtained using different imaging conditions, such as: different wavelengths, different focal conditions, different illumination types (such as annular, quadrapole, immersion, etc.), different measurement techniques, etc.

Figure 3:
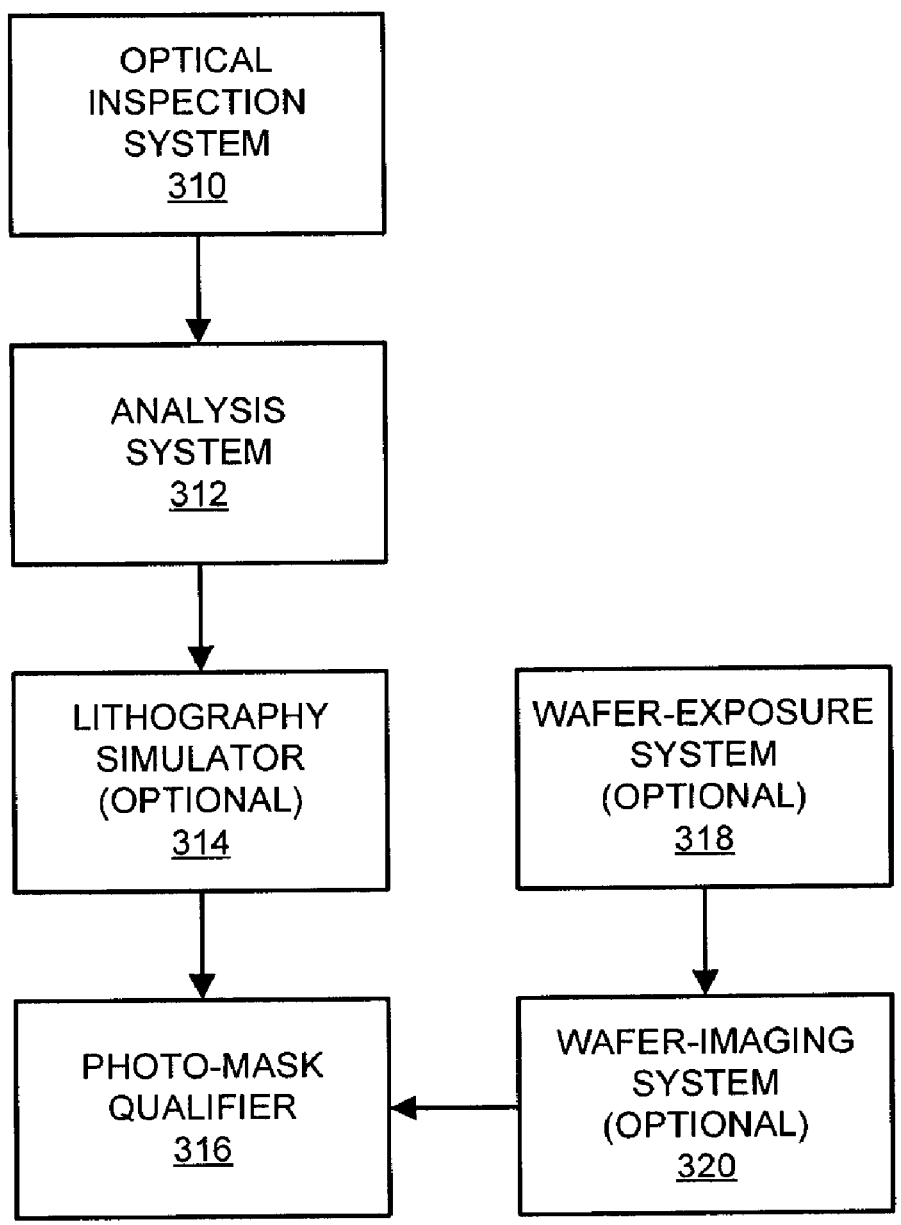
FIG. 3 is a block diagram illustrating a photo-mask inspection and qualification system in accordance with an embodiment of the present invention.

FIG. 3 presents a block diagram illustrating a photo-mask inspection and qualification system 300. In this system, one or more inspection images of the photo-mask are obtained using optical inspection system 310.

Then, an analysis system 312 determines the reconstructed mask pattern based on the one or more inspection images and a target mask pattern. As noted previously, and described further below with reference to FIG. 4, in some embodiments the reconstructed mask pattern is determined using the constrained inverse optical calculation based on information about an optical path associated with optical inspection system 310, including the characteristic of this optical path. In the process, analysis system 312 may recover lost information in the one or more inspection images (for example, due to a finite numerical aperture in optical inspection system 310) and/or to correct for image artifacts, such as those due to focal errors and/or optical aberrations. Therefore, the reconstructed mask pattern may include additional spatial frequencies than the one or more inspection images.

Additionally, photo-mask qualifier 316 may use the constant feature width(s) in the reconstructed mask pattern to determine a critical-dimension bias of the photo-mask, and may determine an acceptance condition of the photo-mask based on the critical-dimension bias. For example, the photo-mask may be acceptable if the critical-dimension bias is less than 10 nm or 5% of a critical dimension in the target mask pattern. Alternatively, if the photo-mask is not acceptable, it may be rejected, subject to rework, or subject to additional qualification testing.

In some embodiments, an optional lithography simulator 314 calculates one or more aerial images based on the reconstructed mask pattern and a source pattern that 'illuminates' the reconstructed mask pattern during the calculation. (Alternatively, optional lithography simulator 314 may calculate the one or more aerial images based on the source pattern, the target mask pattern and a mask-defect pattern, which was determined by comparing the target mask pattern and the reconstructed mask pattern.) As noted previously, and described further below with reference to FIG. 5, in some embodiments the one or more aerial images are calculated using a forward optical calculation based on the information about an optical path associated with the photolithographic process (such as a model of the optical path in the exposure tool). Furthermore, in some embodiments optional lithography simulator 314 may calculate an estimated resist pattern based on the one or more aerial images and the model of the photoresist in the photolithographic process. Thus, in some embodiments optional lithography simulator 314 calculates a simulated or estimated wafer pattern that can be produced in the photolithographic process.

Then, photo-mask qualifier 316 may identify a difference(s) between the one or more aerial images and/or the estimated resist pattern and the target pattern, and may determine the acceptance condition of the photo-mask based on the identified difference(s). For example, photo-mask qualifier 316 may analyze the one or more aerial images and/or the estimated resist pattern to determine if it is acceptable, e.g., if differences with respect to the target pattern and/or any defects that are present are within acceptable bounds, such as a fraction of a critical dimension in the target pattern. (In embodiments where the one or more aerial images are used, this may involve prior correlation with the critical dimension(s) of a test wafer.) If yes, the photo-mask may be accepted, and if not the photo-mask may be rejected, subject to rework, or subject to additional qualification testing. Note that, in some embodiments, photo-mask acceptance is also based, at least in part, on a comparison of the reconstructed mask pattern and at least a portion of the target mask pattern for the same or a different photo-mask (which is sometimes referred to as 'die-to-database inspection').

In some embodiments, the photo-mask is accepted (or not) based on a process window (such as a range of exposure times, a depth of focus, a range of exposure intensities, and/or a normalized image log slope) associated with the reconstructed mask pattern. In this way, a particular defect in the photo-mask that is fatal when slightly overexposed may be identified, even though it is negligible at the nominal dose. In addition, in some embodiments the photo-mask is accepted (or not) based on features in the one or more aerial images and/or the estimated resist pattern that are identified over or throughout the process window and/or based on an impact on a critical dimension across the process window. Note that acceptance of the photo-mask may be fully automated, while in other embodiments it may not be fully automated. Thus, information (such as identified critical-dimension bias, differences and/or features) may be presented to an operator, who may verify an acceptance condition made by photo-mask inspection and qualification system 300 (FIG. 3) or who may independently determine whether or not to accept the photo-mask.

Alternatively or additionally, the photo-mask may be qualified based on comparisons between the estimated resist pattern and actual patterned wafer patterns produced or generated using the photo-mask. For example, an optional wafer-exposure system 318 (i.e., the exposure tool) may be used to produce a printed wafer using the photo-mask, and a printed wafer image of the pattern on the printed wafer may be determined using an optional wafer-imaging system 320 (such as the PUMA™ patterned wafer-inspection platform from KLA-Tencor, Inc., of San Jose, Calif.). However, this brute-force approach is often expensive and time consuming. In addition, errors introduced in the photolithographic process in optional wafer-exposure system 318 may reduce the accuracy of the qualification decision made by photo-mask qualifier 316.

Thus, the calculation technique may overcome the limitations of CD-SEM images by providing a high-throughput and efficient technique without requiring the use of additional equipment (i.e., the mask inspection system can be used to perform mask inspection) for determining whether or not the photo-mask (including any defects) is acceptable. Consequently, the calculation technique may improve photo-mask and/or wafer yield, and thus may decrease the cost and time to market of photo-masks and integrated circuits.

Figure 4:
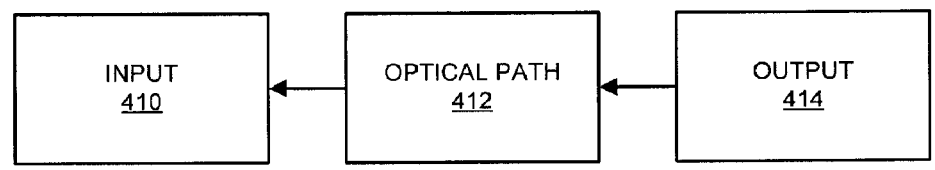
FIG. 4 is a block diagram illustrating an inverse optical calculation in accordance with an embodiment of the present invention.

FIG. 4 presents a block diagram illustrating an inverse optical calculation 400. In this calculation, a predicted input 410 (such as a predicted reconstructed mask pattern) at an object plane of optical path 412 is determined based on an output 414 (such as an inspection image) at an image plane of optical path 412. For example, the reconstructed mask pattern at the object plane may be determined from an inspection image using the target mask pattern and information about the optical path in optical inspection system 310 (FIG. 3). Note that information about optical path 412 may include the characteristic of optical path 412, such as an optical bandwidth of optical path 412.

In particular, the reconstructed mask pattern of the photo-mask at the object plane may be determined from the inspection image at the image plane and the target mask pattern at object plane, as well as from information about the optical path in optical inspection system 310 (FIG. 3). In particular, $$R = I^{-1}IM,$$

where I is a forward optical path (described with reference to FIG. 5 below), $I^{-1}$ is an inverse optical path operator, M is the actual (physical) mask pattern, and the application of I to M is the inspection image, and R is the reconstructed mask pattern. As noted previously, the reconstructed mask pattern may be characterized by additional spatial frequencies than the inspection image (e.g., it includes additional magnitude and/or phase information at one or more additional spatial frequencies). For example, if the inspection image may be characterized by a band of spatial frequencies, the reconstructed mask pattern may be characterized by another band of spatial frequencies that includes the band of spatial frequencies, and which approximately equals the band of spatial frequencies associated with the photo-mask.

While the preceding discussion illustrates the inverse optical calculation using a single output 414, in other embodiments two or more inspection images at image plane(s) of optical path 412 may be used. For example, instead of the inspection image, there may be a set of inspection images that are each determined using different wavelengths, different focal conditions (e.g., on different focal surfaces or planes), and/or different imaging conditions in optical inspection system 310 (FIG. 3). These inspection images may include magnitude and/or phase information. For example, inspection images that include magnitude and relative phase information may be measured by generating an interference pattern using measurement and reference beams derived from a common light source or that are spatially and temporally coherent. Alternatively, phase contrast optics may be utilized. In some embodiments, the difference of two inspection images at image plane(s) may be used in the inverse optical calculation 400. Furthermore, in some embodiments each of the inspection images at the image plane(s) used in the inverse optical calculation 400 or a term(s) including some combination of the inspection images at the image plane(s) may be multiplied by a corresponding weight. In this way, inverse optical calculation 400 may emphasize one or more of the inspection images at an image plane relative to other inspection images (at the same or other image planes) used in inverse optical calculation 400.

In some embodiments, inverse optical calculation 400 is based on iterative minimization of an error function (H), which is also sometimes referred to as a 'cost function' or a 'Hamiltonian function.' In particular, during each iteration of inverse optical calculation 400 the error function may be a function of the difference between output 414 and a pattern (or image) that results when input 410 is projected through optical path 412. In some embodiments, input 410 initially corresponds to the target mask pattern, and as the calculation progresses this pattern is allowed to evolve while output 414 is held constant (subject to the constraint that there are a finite number of discrete feature widths allowed in input 410, and where a given feature has a constant feature width). In embodiments with multiple patterns (or images) at object plane(s) and/or image plane(s), the error function (H) equals $$\sum_{j=1}^{N} w_j |I_j - I_{oj}|^n,$$

where $I_j$ is the forward projection of the jth reconstructed mask pattern at the object plane (out of N patterns in this example) through optical path 412, $w_j$ is a corresponding weight, $I_{oj}$ is the jth inspection image at an image plane, and n is a power. Note that the error function (H) approaches zero as $I_j$ approaches $I_{oj}$.

In an exemplary embodiment, N is 3 and n is 2. Three patterns (or inspection images) at the image plane(s) may be determined at three different focal conditions (or focus settings) in optical inspection system 310 (FIG. 3). For example, with a wavelength of 260 nm, the focal conditions may be at −600 nm (relative to nominal focus), at 0 nm (i.e., at nominal focus), and 600 nm (relative to nominal focus). Alternatively or in addition, the three patterns (or inspection images) at the image plane(s) may be determined at three different wavelengths or imaging conditions. Furthermore, a corresponding set of weights $\{w_j\}$ may be 1, 0.1, and 1.

In other embodiments, the weights are varied as inverse optical calculation 400 progresses and/or different weights are used for specific parts (or even pixels) of a pattern. For example, the weights may be determined based on the difference between $I_j$ and $I_{oj}$ at a given step in inverse optical calculation 400. This approach may exaggerate the features or defects, especially when inverse optical calculation 400 is close to a local or global minimum and the error function (H) corresponds to small differences. Thus, in general the error function (H) may be expressed as a double integral over the pattern or image area and there may be separate time-dependent weights for $I_j$ and $I_{oj}$. Furthermore, in some embodiments the error function (H) is expressed as a relative difference between $I_j$ and $I_{oj}$ for at least a portion of inverse optical calculation 400 as it progresses.

It will be recognized by one of ordinary skill in the art that inverse optical calculation 400 described above is poorly defined. In particular, numerous possible reconstructed mask patterns at the object plane may result from the same observed output 414. Therefore, input 410 may be selected such that it is 'most likely' to represent the actual photo-mask. A variety of constraints and additional criteria may be imposed when determining the solution(s) to this problem in order to find a unique answer(s). For example, input 410 may be that which has the smallest value of the error function (H).

Other constraints based on a priori knowledge of the photo-mask manufacturing process may also be applied to resolve the ambiguity among several competing candidate defect possibilities (i.e., different possible solutions for input 410). For example, there may be a priori knowledge about typical defect types (including the distribution of defect sizes and phases) that arise during the photo-mask manufacturing process. In addition, information may also be obtained from neighboring defects on the photo-mask that is being inspected, or from previous photo-masks that were manufactured on the same process line and inspected. For example, given the likelihood that point defects tend to be generated by common mechanisms, a common link between more than one such defects may constrain the possible solution options in inverse optical calculation 400.

One common type of defect is known as a critical-dimension defect or a sizing error. This type of defect is not an isolated feature (i.e., a feature where one does not belong), or a missing feature (i.e., where one was expected), but rather an error in the dimension of the feature being patterned on the photo-mask. In addition, the large mask error enhancement factors (MEEFs) of leading-edge lithographic processes makes it important to understand how such observed critical-dimension defects on or in photo-masks impact wafer manufacturing (i.e., the printed patterns on wafers). By determining the average critical dimension while calculating the reconstructed mask pattern, the calculation technique is well suited to identifying and assessing the impact (i.e., the significance) of these and other defects in the photo-masks.

Figure 5:
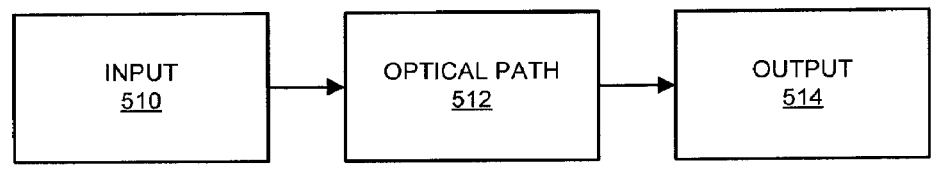
FIG. 5 is a block diagram illustrating a forward optical calculation in accordance with an embodiment of the present invention.

FIG. 5 presents a block diagram illustrating a forward optical calculation 500. In this calculation, a suitable illuminated input 510 (such as the reconstructed mask pattern) at an object plane of optical path 512 is used to determine a predicted output 514 (such as an aerial image) at an image plane of optical path 512. For example, using the reconstructed mask pattern, a source pattern, and information about an optical path associated with optional wafer-exposure system 318 (FIG. 3), the aerial image can be determined. Note that optical path 512 may be different than optical path 412 (FIG. 4). In general, information about optical path 512 may include some or all of the aspects of the photolithographic process, such as illumination settings, the electromagnetics of the photo-mask, the exposure-tool optics, optical effects, etc. In addition, in some embodiments forward optical calculation 500 models the effect of a photoresist, including flare and/or etch effects.

Note that calculations corresponding to one or more optical paths in inverse optical calculation 400 (FIG. 4) and/or forward optical calculation 500 may be implemented using Fourier-optical techniques. Furthermore, the optical paths in inverse optical calculation 400 (FIG. 4) and/or forward optical calculation 500 may include multiple models of optical paths (such as when the set of second inspection images includes inspection images from two or more different optical inspection systems), which are then used to determine the reconstructed mask pattern. Also note that while optical path 412 (FIG. 4) and optical path 512 have been traversed in particular directions, each of these optical paths may be traversed in either direction.

We now describe an exemplary embodiment of the forward optical calculation or forward projection operation used to calculate the aerial image and/or the estimated resist pattern. For simplicity, coherent illumination of the estimated photo-mask is utilized. Furthermore, the electric field falling upon the photo-mask is approximately constant. Thus, the clear regions of the photo-mask pass the light, while the opaque regions block the light. It follows that a scalar electric field E, just behind the photo-mask, may be expressed as $$E(\vec{r}) = \begin{Bmatrix} 0 & \text{chrome} \\ 1 & \text{glass} \end{Bmatrix},$$

where $\vec{r}=(x, y)$ is a point on the $(x, y)$ plane. As discussed below with reference to FIG. 6, this representation of the photo-mask may be re-expressed using a function $\phi$ (referred to as a level-set function) having positive regions that indicate glass and negative regions that indicate chrome. Furthermore, the level-set function may equal zero at the boundaries or contours of the photo-mask. Therefore, the electric field E associated with the photo-mask may be re-expressed as a function of this level-set function, i.e., $$E(\vec{r}) = \hat{h}(\phi(x,y)),$$

where $\hat{h}$ is the Heaviside function $$\hat{h}(x) = \begin{Bmatrix} 1 & x \geq 0 \\ 0 & x < 0 \end{Bmatrix}.$$

Since an ideal diffraction limited lens acts as a low-pass filter, this may be used as an approximation to the actual (almost but not quite perfect) lens in the optical path of optional wafer-exposure system 318 in FIG. 3 (in this example). Mathematically, the action of the lens may be expressed as $$A(\vec{r}) = f^{-1}(\hat{C}(f(E(\vec{r}))))$$

where $A(\vec{r})$ indicates the electric field distribution on the wafer, f indicates the Fourier transform, $f^{-1}$ indicates the inverse Fourier transform, and $\hat{C}$ indicates the pupil cutoff function, which is zero for frequencies larger than a threshold determined by the numerical aperture of the lens, and one otherwise. Thus, the pupil function is $$\hat{C}(k_x, k_y) = \hat{h}(k_{max}^2 - [k_x^2 + k_y^2]) = \begin{Bmatrix} 0 & k_x^2 + k_y^2 \geq k_{max}^2 \\ 1 & k_x^2 + k_y^2 < k_{max}^2 \end{Bmatrix},$$

wherein $k_x$, $k_y$, and $k_{max}$ represent frequency coordinates in Fourier space. Therefore, the aerial image (at the wafer in optional wafer-exposure system 318 in FIG. 3) is simply the square of the electric field $$I(\vec{r}) = |A(\vec{r})|^2.$$

Combining these two equations, we find $$F(\phi(x,y)) = (|f^{-1}(\hat{C}(f(\hat{h}(\phi(x,y)))))|^2).$$

This is a self-contained formula for the aerial image obtained by optional wafer-exposure system 318 (FIG. 3).

Note that this is just one embodiment of the forward projector that can be used within the scope of this disclosure, chosen by way of example due to its relative simplicity. More sophisticated forward models also fall within the scope of the present disclosure. Such models may take into account, by way of example but not limitation, various illumination conditions (e.g., off-axis, incoherent), the actual electromagnetics of the light field interacting with the photo-mask, various types of photo-masks other than chrome on glass (e.g., attenuated phase shifting, strong phase shifting, other materials, etc.), the polarization of the light field, the actual properties of the lens (such as aberrations), and/or the vector nature of the electromagnetic field as it propagates through the optical path.

Figure 6:
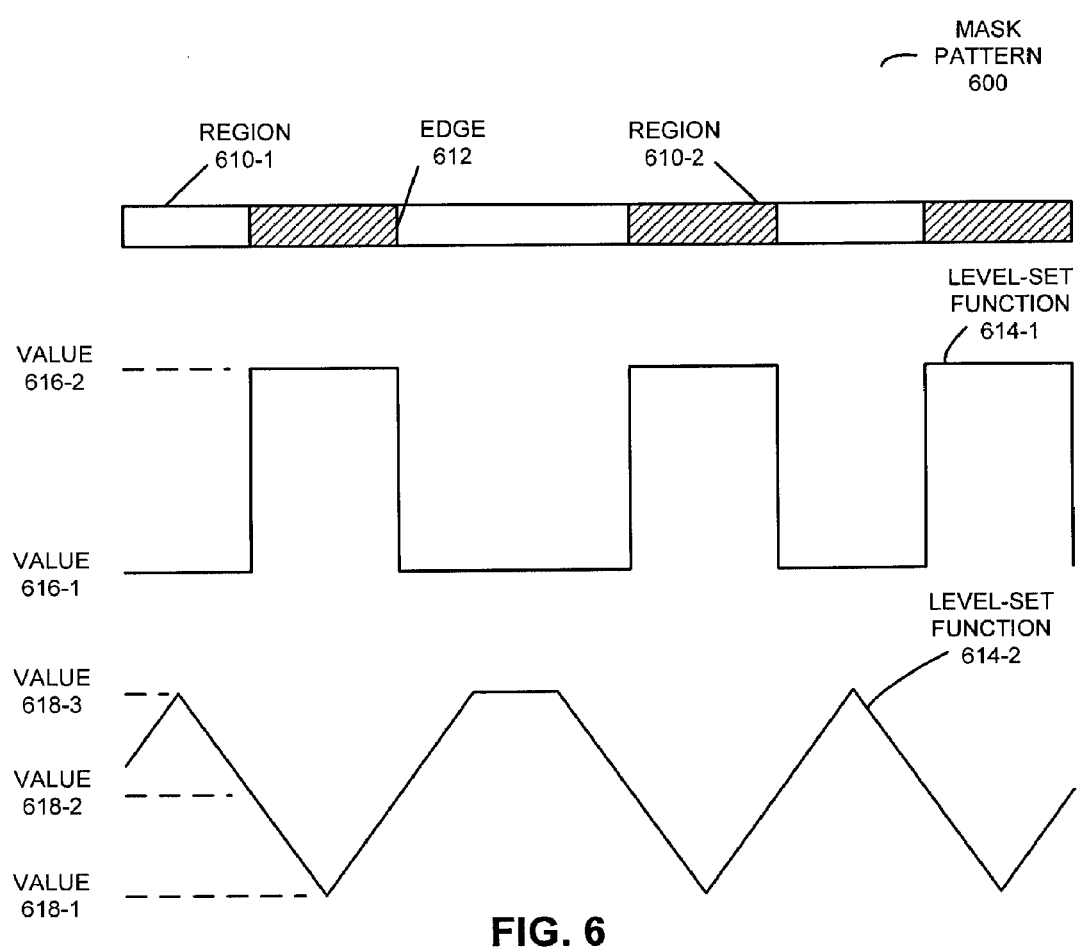
FIG. 6 illustrates a mask pattern and corresponding level-set functions in accordance with an embodiment of the present invention.

We now describe the level-set functions in more detail. As noted previously, the reconstructed mask pattern being determined in the constrained inverse optical calculation 400 may be represented as a function having a set of values that is larger than those in the inspection image. In some embodiments, the function is a level-set function. This is illustrated in FIG. 6, which provides a mask pattern 600 and corresponding level-set functions 614. This mask pattern includes alternating regions with glass (610-1) and chromium (610-2). Transitions from one region to another are characterized by a contour or an edge, such as edge 612. When viewed from a direction perpendicular to a plane of the photo-mask, edge 612 defines mask pattern 600.

Level-set function 614-1 has two values 616. Furthermore, edge 612 may correspond to a mid-point between these two values 616. In contrast, level-set function 614-2 has three values 618, and edge 612 may correspond to value 618-2. While not illustrated in FIG. 6, level-set functions 614 extend into the plane of FIG. 6 (e.g., they may be 3-dimension functions). As is known to one of skill in the art, there are many alternate level-set functions and/or configurations that may be used. For example, in some embodiments one or more separate level-set functions and/or separate patterns or images may be used for the features or defects.

As illustrated by level-set function 614-2, in some embodiments the level-set function may be expressed as a signed distance function relative to the contour or edge 612 (e.g., the value of the level-set function in at least a region is a function of the distance from the edge 612). This formulation may allow effects that occur nearer to the edge 612 (such as critical-dimension defects) to be highlighted. However, because features or defects in photo-masks may occur at random locations (including those far removed from edge 612), level-set function 614-1 may be useful in that it provides an equal weighting with respect to edge 612.

In some embodiments, during each iteration of inverse optical calculation 400 (FIG. 4) the level-set function corresponding to input 410 (FIG. 4) being modified is updated according to $$\phi_{i+1} = \phi_i + \Delta t \cdot \nabla(H),$$

where $\phi_{i+1}$ is an updated version of the level-set function, $\phi_i$ is the current version of the level-set function, $\Delta t$ is a step size in the calculation and $\nabla(H)$ is a gradient or a derivative of the error function. In an exemplary embodiment, $\nabla(H)$ is $$\left.\frac{\delta H}{\delta \phi}\right|_{\varphi_i},$$

i.e., it is the Frechet derivative of the error function H. Furthermore, in some embodiments $\nabla(H)$ is the direction of steepest descent for minimizing or optimizing H by changing $\phi$. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of inverse optical calculation 400 (FIG. 4). In particular, the error function H may be allowed to increase during some steps as the calculation evolves. In this way, the global minimum in the multi-dimensional space may be determined. Note that the size of this multi-dimensional space may be a number of quantization levels to the power of the number of pixels in the reconstructed mask pattern or in the inspection image. In an exemplary embodiment, the pattern or image has at least 1 million pixels (for example, 1024×1024).

In one embodiment, in any iteration of inverse optical calculation 400 (FIG. 4), changes in $\phi$ that decrease or increase the error function (H) up to 0.5% are performed. If a larger change will result (e.g., $\Delta H > 0.5\%$), the step size $\Delta t$ may be decreased by a factor that is at least greater than 1 and the change in $\phi$ is implemented (or not) based on a probability and a value P given by $$e^{\frac{-kH_{i+1}}{H_i}},$$

where $H_{i+1}$ is the error function in the $i+1^{th}$ iteration (if the change in $\phi$ is implemented) and $H_i$ is the error function in $i^{th}$ iteration (note that the ratio of $H_{i+1}/H_i$ equals $1+\Delta H$). In some embodiments k is 0.155. For example, if the value P is 0.3 and the probability is a random (or pseudorandom) number between 0 and 1 that is less than P, the error function may be increased before proceeding. In this way, inverse optical calculation 400 (FIG. 4) initially takes large steps and thereby explores the solution space.

Furthermore, in some embodiments inverse optical calculation 400 (FIG. 4) is divided into a series of overlapping sub-problems (also referred to as 'work units') at least some of which are processed independently and/or concurrently. These work units may be based on elements or structures (for example, repetitive structures) in the reconstructed mask pattern, the target pattern, and/or in the inspection image. In some embodiments, the works units are selected such that there is a probability exceeding a pre-defined value (e.g., a high probability) that most if not all of the work units include at most one defect (for example, the work units may be based on differences between an inspection image and a simulated inspection image that is determined using the target mask pattern). Furthermore, in some embodiments the work units may partially overlap neighboring work units. For example, the work units may be between 10,000 $nm^2$ and 100 $\mu m^2$ in size.

In some embodiments, inverse optical calculation 400 (FIG. 4) is run for 100, 1000 or 10,000 iterations at which point the optimal solution has been determined. In other embodiments, the calculation is stopped based on convergence criteria, such as oscillatory behavior, a relative and/or absolute difference between the inspection image and images that result when the reconstructed mask pattern is projected through optical path 412 (FIG. 4), the latest change to the error function H, and/or the history of changes to the error function H. For example, the relative difference may be less than 1% and/or the absolute difference may be 10 nm for a critical dimension of 100 nm. Note that in some embodiments, the level-set function is re-distanced (i.e., restored to one having the distance function property relative to the edge 612) at intermediate iterations during inverse optical calculation 400 (FIG. 4). In an exemplary embodiment, such re-distancing occurs at least every 20 iterations (for example, every 14 iterations).

Using this inverse calculation approach, features smaller than the wavelength of the light source used to perform optical measurements or to print wafer patterns in the photolithographic process may be determined. For example, in simulations using a light source having a wavelength of 260 nm, features and defects as small as $(40 \text{ nm})^2$ on a photo-mask were determined.

We now discuss computer systems for implementing the calculation technique. FIG. 7 presents a block diagram illustrating a computer system 700. Computer system 700 includes one or more processors 710, a communication interface 712, a user interface 714, and one or more signal lines 722 coupling these components together. Note that the one or more processors 710 may support parallel processing and/or multi-threaded operation, the communication interface 712 may have a persistent communication connection, and the one or more signal lines 722 may constitute a communication bus. Moreover, the user interface 714 may include a display 716, a keyboard 718, and/or a pointer 720, such as a mouse.

Memory 724 in the computer system 700 may include volatile memory and/or non-volatile memory. More specifically, memory 724 may include ROM, RAM, EPROM, EEPROM, flash, one or more smart cards, one or more magnetic disc storage devices, and/or one or more optical storage devices. Memory 724 may store an operating system 726 that includes procedures (or a set of instructions) for handling various basic system services for performing hardware dependent tasks. The memory 724 may also store procedures (or a set of instructions) in a communication module 728. The communication procedures may be used for communicating with one or more computers and/or servers, including computers and/or servers that are remotely located with respect to the computer system 700.

Memory 724 may also include multiple program modules (or a set of instructions), including: analysis module 730 (or a set of instructions), lithography simulator 732 (or a set of instructions), and/or photo-mask qualifier 734 (or a set of instructions). Note that one or more of these program modules (or sets of instructions) may constitute a computer-program mechanism. Furthermore, note that one or more of these program modules (or sets of instructions) may be implemented as a stand-alone software application, or as a program module or subroutine in another application, such as photo-mask inspection software.

Figure 8:
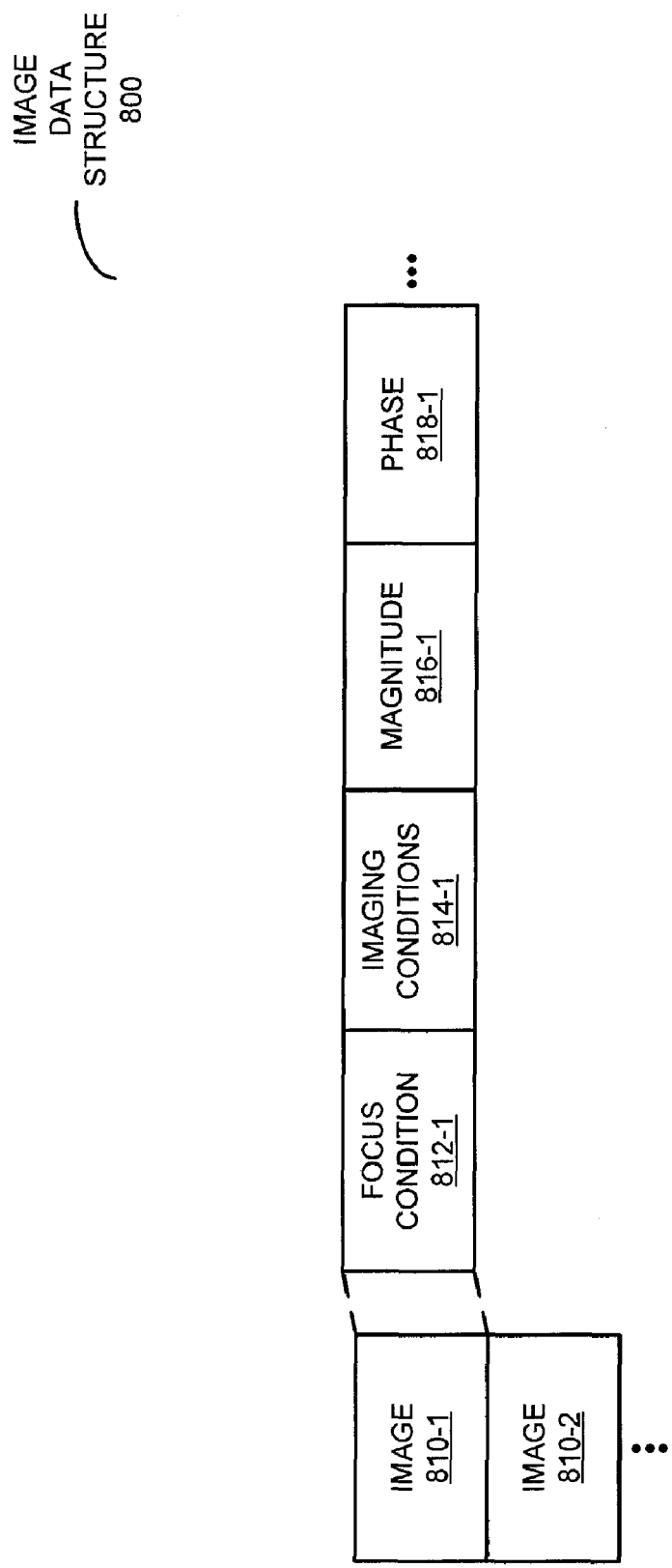
FIG. 8 is a block diagram illustrating an image data structure in accordance with an embodiment of the present invention.

During operation, computer system 700 may receive inspection image(s) 736 associated with a photo-mask. FIG. 8 presents a block diagram illustrating an image data structure 800. This image data structure may include information corresponding to one or more images 810 (such as inspection image(s) 736). For a given image, such as image 810-1, image data structure 800 may include: a focal plane or focus condition 812-1 at which image 810-1 was acquired, other imaging conditions 814-1 at which the image 810-1 was measured, and spatial variation in magnitude 816-1 and/or phase 818-1 information in image 810-1.

Referring back to FIG. 7, analysis module 730 may determine reconstructed mask pattern 738 in a constrained inverse optical calculation using inspection image(s) 736, target mask pattern 740, information about a first optical path 742 associated with optical inspection system 310 (FIG. 3), and one or more discrete feature widths 744. Furthermore, by comparing a determined average critical dimension 746 of reconstructed mask pattern 738 with a target average critical dimension 748 of target mask pattern 740, analysis module 730 may determine critical-dimension bias 750. In some embodiments, by comparing reconstructed mask pattern 738 and target mask pattern 740, analysis module 730 may determine defect(s) 752 in reconstructed mask pattern 738.

Furthermore, in some embodiments lithography simulator 732 may calculate one or more aerial image(s) 754 in a forward optical calculation using reconstructed mask pattern 738, information about a second optical path 756 (such as that associated with optional wafer-exposure system 318 in FIG. 3), and photolithographic conditions 758 (including a source pattern). Furthermore, lithography simulator 732 may calculate estimated resist pattern(s) 760 using the one or more aerial image(s) 754 and a photoresist model 762. After at least some of these calculations are performed, photo-mask qualifier 734 may identify a difference(s) 764 (or features) between the one or more aerial image(s) 754 and/or estimated resist pattern(s) 760 and target pattern(s) 766 (such as portions of a circuit).

Using critical-dimension bias 750, defect(s) 752 and/or difference(s) 764, photo-mask qualifier 734 may determine an acceptance condition 768 of the photo-mask.

Instructions in the various modules in memory 724 may be implemented in a high-level procedural language, an object-oriented programming language, and/or in an assembly or machine language. The programming language may be compiled or interpreted, i.e, configurable or configured to be executed, by the one or more processors 710.

In some embodiments, at least some of the information in memory 724 is encrypted. For example, the lithographic simulator 732 and/or its output files (such as estimated resist pattern(s) 760) may be encrypted so that integrated-circuit manufacturers are more willing to share this information with photo-mask shops (where photo-mask inspection may be performed). As discussed further below, in an alternate approach, the photo-mask shop may send the photo-mask images (e.g., inspection image(s) 736) to integrated-circuit manufacturers, who may perform wafer-pattern simulations and/or may determine photo-mask acceptance. Therefore, information 'stored' in memory 724 in FIG. 7 may be stored locally and/or at remote locations.

Although the computer system 700 is illustrated as having a number of discrete items, FIG. 7 is intended to be a functional description of the various features that may be present in the computer system 700 rather than as a structural schematic of the embodiments described herein. In practice, and as recognized by those of ordinary skill in the art, the functions of the computer system 700 may be distributed over a large number of servers or computers, with various groups of the servers or computers performing particular subsets of the functions. In some embodiments, some or all of the functionality of the computer system 700 may be implemented in one or more ASICs, one or more field programmable gate arrays (FPGAs), and/or one or more digital signal processors (DSPs). In some embodiments the functionality of the computer system 700 may be implemented more in hardware and less in software, or less in hardware and more in software, as is known in the art.

In the preceding discussion, a 'computer system' may include a variety of devices, such as: a personal computer, a laptop computer, a mainframe computer, a portable electronic device, a server and/or a client computer (in a client-server architecture), and/or other device capable of manipulating computer-readable data or communicating such data between two or more computing systems over a network (such as the Internet, an Intranet, a LAN, a WAN, a MAN, or combination of networks, or other technology enabling communication between computing systems).

In some embodiments, reconstructed mask pattern 200 (FIG. 2A), reconstructed mask pattern 250 (FIG. 2B), photo-mask inspection and qualification system 300 (FIG. 3), inverse optical calculation 400 (FIG. 4), forward optical calculation 500 (FIG. 5), mask pattern 600 (FIG. 6) and corresponding level-set functions 614 (FIG. 6), computer system 700, and/or image data structure 800 (FIG. 8) include fewer or additional components. Furthermore, in these embodiments two or more components are combined into a single component and/or a position of one or more components may be changed.

As discussed previously, at least a portion of the calculation technique described may be implemented at a remote location. For example, the inspection image may be measured at a first location, and then provided to computer system 700 at a second (remote) location. After calculating the reconstructed mask pattern, the aerial image and/or the estimated resist pattern, and determining a critical-dimension bias, identifying differences or features and/or determining an acceptance condition of the photo-mask, results may be reported back to the first location. This approach may allow photo-mask shops and integrated-circuit manufacturers to work together to determine whether or not a photo-mask is acceptable, or should be reworked or rejected. Historically, both of these parties have had reservations about such an arrangement. Photo-mask shops may be reluctant because it places the ability to reject a photo-mask in the hands of the end user (the integrated-circuit manufacturer), who may be cautious about accepting a photo-mask and may not have a financial motivation to accept a photo-mask that is less than optimal. In particular, since there is no cost to the end user, any potential defect may result in a photo-mask being rejected and the photo-mask shop may be forced to rewrite the photo-mask at their expense.

The approach described above may help resolve this conflict by creating a computational infrastructure that is agreed upon by both the photo-mask shop and the integrated-circuit manufacturer. In embodiments where photo-mask acceptance is fully automated, computer system 700 may be installed at the integrated-circuit manufacturer and inspection images sent by the photo-mask shop may be processed without exposing the details of the integrated-circuit manufacturing process to the photo-mask maker, and yet at the same time without exposing the photo-mask shop to the human judgment of the integrated-circuit manufacturer in accepting or rejecting photo-masks.

Alternatively, the photo-mask shop may calculate the reconstructed mask pattern from the inspection image, which is then sent to the integrated-circuit manufacturer where simulations of wafer patterns under various process conditions may be performed. The results may be sent back to the photo-mask shop, where they may be used to determine the disposition of defects (e.g., whether or not the photo-mask is acceptable). Therefore, the embodiments of the system and method described herein may be implemented by the photo-mask shop and/or by the integrated-circuit manufacturer.

While the preceding discussion used a photo-mask as an illustrative example, in other embodiments the calculation technique is applied to other types of images. For example, the calculation technique may be applied during the inspection and qualification of a patterned wafer (or semiconductor die) that is fabricated using a photolithographic or direct write process. In particular, a reconstructed wafer inspection image of the patterned wafer may be determined from a wafer inspection image (which may be obtained using optional wafer imaging system 320 in FIG. 3) and at least a portion of the target pattern. More generally, the calculation technique may be used in a wide variety of imaging and/or measurement applications that are based on wave phenomena propagating in different types of media (such as electromagnetic waves and sound waves) and at different ranges of wavelengths (such as audio, radio, microwave, infrared, visible, ultra violet, and x-ray).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for determining a reconstructed mask pattern, comprising:
receiving a target mask pattern;
receiving an image of at least a portion of a photo-mask corresponding to a mask pattern, wherein the image is determined using inspection optics having an optical path; and
reconstructing, using a computer, the mask pattern from the image based on a characteristic of the optical path and the target mask pattern, wherein the mask pattern is reconstructed using a constrained inverse optical calculation in which there are a finite number of discrete feature widths allowed in the reconstructed mask pattern, and wherein a given feature has a constant feature width.

2. The method of claim 1, wherein the reconstructed mask pattern is characterized by additional spatial frequencies than the image.

3. The method of claim 1, wherein, in the constrained inverse optical calculation, the image is at an image plane of a model of the optical path and the mask pattern is at an object plane of the model of the optical path.

4. The method of claim 1, wherein the characteristic includes a range of wavelengths transmitted via the optical path.

5. The method of claim 1, wherein the features in the reconstructed mask pattern each have the constant feature width.

6. The method of claim 5, wherein the constant feature width is an average critical dimension of the reconstructed mask pattern.

7. The method of claim 6, wherein the method further comprises comparing the average critical dimension of the reconstructed mask pattern to an average critical dimension of the target mask pattern to determine a critical-dimension bias of the photo-mask.

8. The method of claim 7, wherein the method further comprises determining an acceptance condition of the photo-mask based on the critical-dimension bias.

9. The method of claim 6, wherein the average critical dimension is associated with a minimum of a cost function in the inverse optical calculation; and
wherein the cost function corresponds to a difference between the reconstructed mask pattern and the target mask pattern.

10. The method of claim 1, wherein, by constraining the inverse optical calculation a convergence time of the inverse optical calculation is faster than that of an unconstrained inverse optical calculation.

11. The method of claim 1, wherein primary features in the reconstructed mask pattern each have the constant feature width; and
wherein sub-resolution assist features in the reconstructed mask pattern each have another constant feature width, which is different than the constant feature width.

12. The method of claim 1, wherein the spatial frequencies in the image are greater than or equal to a spatial frequency corresponding to an average critical dimension of the target mask pattern.

13. A non-transitory computer-program product for use in conjunction with a computer system, the computer-program product comprising a computer-readable storage medium and a computer-program mechanism embedded therein to determine a reconstructed mask pattern, the computer-program mechanism including:

instructions for receiving a target mask pattern;

instructions for receiving an image of at least a portion of a photo-mask corresponding to a mask pattern, wherein the image is determined using inspection optics having an optical path; and instructions for reconstructing the mask pattern from the image based on a characteristic of the optical path and the target mask pattern, wherein the mask pattern is reconstructed using a constrained inverse optical calculation in which there are a finite number of discrete feature widths allowed in the reconstructed mask pattern, and wherein a given feature has a constant feature width.

14. The computer-program product of claim 13, wherein the reconstructed mask pattern is characterized by additional spatial frequencies than the image.

15. The computer-program product of claim 13, wherein, in the constrained inverse optical calculation, the image is at an image plane of a model of the optical path and the mask pattern is at an object plane of the model of the optical path.

16. The computer-program product of claim 13, wherein the characteristic includes a range of wavelengths transmitted via the optical path.

17. The computer-program product of claim 13, wherein the features in the reconstructed mask pattern each have the constant feature width.

18. The computer-program product of claim 17, wherein the constant feature width is an average critical dimension of the reconstructed mask pattern.

19. The computer-program product of claim 18, wherein the computer-program product further includes comparing the average critical dimension of the reconstructed mask pattern to an average critical dimension of the target mask pattern to determine a critical-dimension bias of the photo-mask.

20. The computer-program product of claim 19, wherein the computer-program product further includes determining an acceptance condition of the photo-mask based on the critical-dimension bias.

21. The computer-program product of claim 18, wherein the average critical dimension is associated with a minimum of a cost function in the inverse optical calculation; and wherein the cost function corresponds to a difference between the reconstructed mask pattern and the target mask pattern.

22. The computer-program product of claim 18, wherein, by constraining the inverse optical calculation a convergence time of the inverse optical calculation is faster than that of an unconstrained inverse optical calculation.

23. The computer-program product of claim 18, wherein primary features in the reconstructed mask pattern each have the constant feature width; and wherein sub-resolution assist features in the reconstructed mask pattern each have another constant feature width, which is different than the constant feature width.

24. The computer-program product of claim 18, wherein the spatial frequencies in the image are greater than or equal to a spatial frequency corresponding to an average critical dimension of the target mask pattern.

25. A computer system, comprising:

at least one processor;

at least one memory; and at least one program module, the program module stored in the memory and configured to be executed by the processor to determine a reconstructed mask pattern, the program module including:

instructions for receiving a target mask pattern;

instructions for receiving an image of at least a portion of a photo-mask corresponding to a mask pattern, wherein the image is determined using inspection optics having an optical path; and instructions for reconstructing the mask pattern from the image based on a characteristic of the optical path and the target mask pattern, wherein the mask pattern is reconstructed using a constrained inverse optical calculation in which there are a finite number of discrete feature widths allowed in the reconstructed mask pattern, and wherein a given feature has a constant feature width.

* * * * *